United States Patent
Grassmann et al.

(10) Patent No.: US 10,453,771 B2
(45) Date of Patent: Oct. 22, 2019

(54) PACKAGE WITH ROUGHENED ENCAPSULATED SURFACE FOR PROMOTING ADHESION

(71) Applicants: Infineon Technologies AG, Neubiberg (DE); HYUNDAI Motor Company, Seoul (KR); Kia Motor Corporation, Seoul (KR)

(72) Inventors: Andreas Grassmann, Regensburg (DE); Juergen Hoegerl, Regensburg (DE); Kiyoung Jang, Incheon (KR); Ivan Nikitin, Regensburg (DE)

(73) Assignees: Infineon Technologies AG, Neubiberg (DE); HYUNDAI Motor Company, Seoul (KR); Kia Motor Corporation, Seoul (KR)

( * ) Notice: Subject to any disclaimer, the term of this patent is extended or adjusted under 35 U.S.C. 154(b) by 0 days.

(21) Appl. No.: 15/709,493

(22) Filed: Sep. 20, 2017

(65) Prior Publication Data

US 2018/0082921 A1 Mar. 22, 2018

(30) Foreign Application Priority Data

Sep. 21, 2016 (DE) .................. 10 2016 117 841

(51) Int. Cl.
*H01L 23/495* (2006.01)
*H01L 23/367* (2006.01)
(Continued)

(52) U.S. Cl.
CPC ...... *H01L 23/3675* (2013.01); *H01L 21/4871* (2013.01); *H01L 21/565* (2013.01);
(Continued)

(58) Field of Classification Search
CPC ............ H01L 23/3675; H01L 21/4871; H01L 21/565; H01L 23/3121; H01L 23/3735; H01L 23/49537
See application file for complete search history.

(56) References Cited

U.S. PATENT DOCUMENTS

| 5,554,569 A | 9/1996 | Ganesan et al. |
| 6,281,573 B1 * | 8/2001 | Atwood ............. H01L 23/3675 165/80.3 |

(Continued)

FOREIGN PATENT DOCUMENTS

| DE | 102009000541 A1 | 8/2010 |
| DE | 102013218486 A1 | 9/2014 |

(Continued)

OTHER PUBLICATIONS

Krebs, Thomas; "Verbindungswerkstoffe in der Leistungselektronik", All-Electronics.de; Optimale Power, Apr. 28, 2011, pp. 1-4; http://www.all-electronics.de/verbindungswerkstoffe-in-der-leistungselektronik.

*Primary Examiner* — Nathan W Ha

(57) ABSTRACT

A package comprising at least one electronic chip, a first heat removal body thermally coupled to a first main surface of the at least one electronic chip and configured for removing thermal energy from the at least one electronic chip, an encapsulant encapsulating at least part of the at least one electronic chip, and part of the first heat removal body, wherein at least part of a surface of the first heat removal body is roughened.

9 Claims, 4 Drawing Sheets

(51) Int. Cl.
  *H01L 21/48* (2006.01)
  *H01L 21/56* (2006.01)
  *H01L 23/31* (2006.01)
  *H01L 23/373* (2006.01)
  *H01L 23/433* (2006.01)
  *H01L 23/00* (2006.01)
  *H01L 25/18* (2006.01)

(52) U.S. Cl.
  CPC ...... *H01L 23/3121* (2013.01); *H01L 23/3735* (2013.01); *H01L 23/4334* (2013.01); *H01L 23/49531* (2013.01); *H01L 23/49537* (2013.01); *H01L 23/49541* (2013.01); *H01L 23/49568* (2013.01); *H01L 23/49575* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 25/18* (2013.01); *H01L 2224/32225* (2013.01); *H01L 2224/32245* (2013.01); *H01L 2224/4813* (2013.01); *H01L 2224/4846* (2013.01); *H01L 2224/48091* (2013.01); *H01L 2224/48106* (2013.01); *H01L 2224/48227* (2013.01); *H01L 2224/48247* (2013.01); *H01L 2224/73265* (2013.01); *H01L 2224/85801* (2013.01); *H01L 2224/92247* (2013.01); *H01L 2924/00014* (2013.01); *H01L 2924/1203* (2013.01); *H01L 2924/13055* (2013.01); *H01L 2924/35121* (2013.01)

(56) References Cited

U.S. PATENT DOCUMENTS

| | | | |
|---|---|---|---|
| 6,670,222 B1 | 12/2003 | Brodsky | |
| 9,786,516 B2* | 10/2017 | Minotti | H01L 23/4334 |
| 2002/0003293 A1 | 1/2002 | Kobayashi | |
| 2002/0047187 A1 | 4/2002 | Nakajima et al. | |
| 2002/0153596 A1 | 10/2002 | Tsubosaki et al. | |
| 2003/0106212 A1* | 6/2003 | Chao | H01L 21/565 29/848 |
| 2004/0012077 A1 | 1/2004 | Ibrahim et al. | |
| 2004/0232534 A1 | 11/2004 | Seki et al. | |
| 2004/0238945 A1 | 12/2004 | Huang et al. | |
| 2005/0068739 A1* | 3/2005 | Arvelo | H01L 23/3675 361/718 |
| 2009/0039486 A1* | 2/2009 | Shimazaki | H01L 21/561 257/676 |
| 2009/0321924 A1 | 12/2009 | Funakoshi et al. | |
| 2010/0096747 A1* | 4/2010 | Kusano | H01L 21/565 257/706 |
| 2010/0279467 A1* | 11/2010 | Magnus | H01L 21/561 438/113 |
| 2010/0299918 A1* | 12/2010 | Oda | H01L 23/3675 29/841 |
| 2011/0117704 A1 | 5/2011 | Shimazaki et al. | |
| 2012/0206882 A1* | 8/2012 | Mohammed | H01L 23/373 361/710 |
| 2014/0048960 A1* | 2/2014 | Yoo | H01L 21/565 257/787 |
| 2014/0168901 A1 | 6/2014 | Ide et al. | |
| 2014/0284783 A1* | 9/2014 | Sayama | H01L 23/34 257/690 |
| 2015/0077941 A1* | 3/2015 | Hosseini | H01L 23/3733 361/704 |
| 2015/0130048 A1* | 5/2015 | Hohlfeld | H01L 21/563 257/735 |
| 2016/0064319 A1* | 3/2016 | Suzuki | H01L 23/49827 174/251 |
| 2016/0276243 A1* | 9/2016 | Smalley | H01L 23/3677 |

FOREIGN PATENT DOCUMENTS

| | | |
|---|---|---|
| DE | 10 2013 207 721 A1 | 10/2014 |
| DE | 11 2014 001 487 T5 | 12/2015 |
| EP | 0579464 A2 | 1/1994 |
| JP | 2008-172172 A | 7/2008 |
| JP | 2012243890 A | 12/2012 |

* cited by examiner

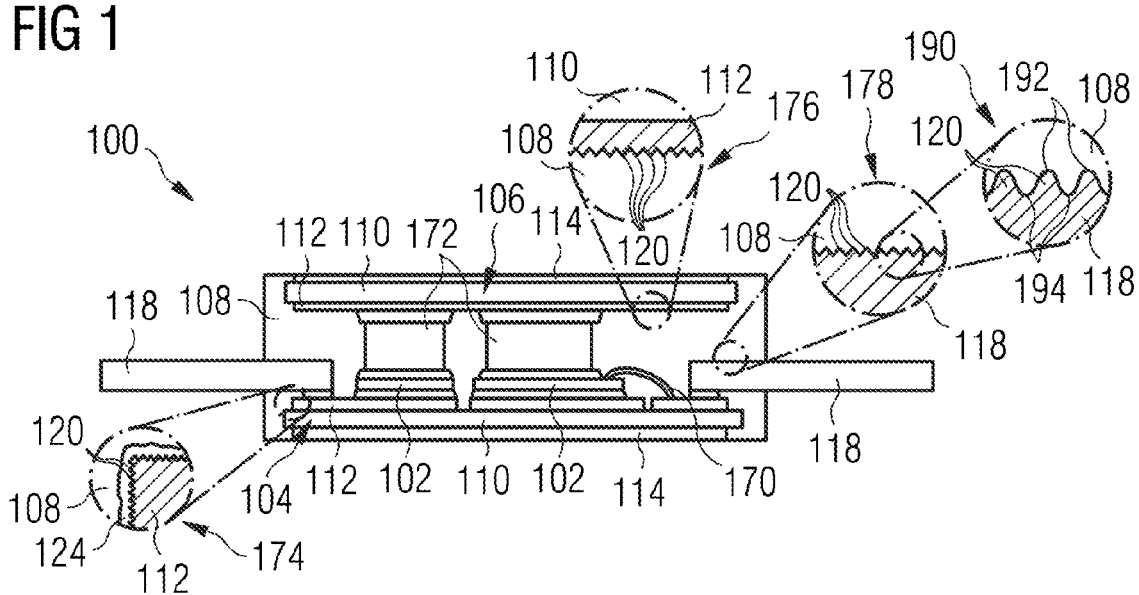
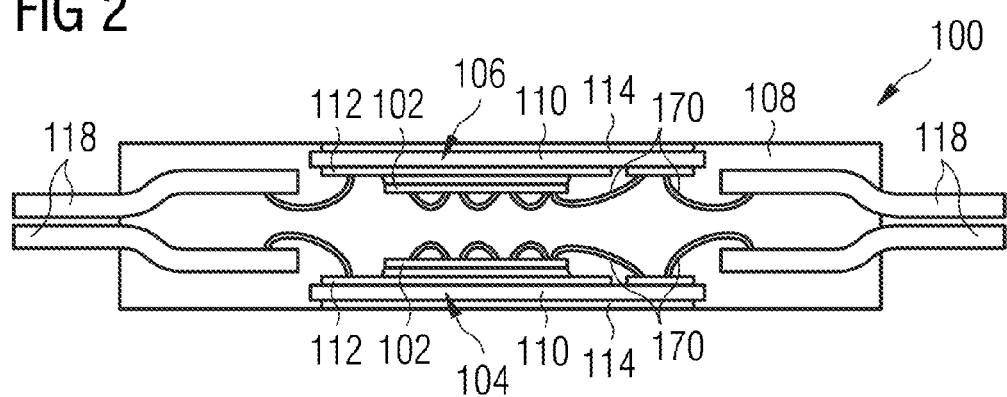

PACKAGE WITH ROUGHENED ENCAPSULATED SURFACE FOR PROMOTING ADHESION

BACKGROUND OF THE INVENTION

Field of the Invention

The present invention relates to packages, to a vehicle, to a method of use, and to methods of manufacturing a package.

Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

There is still potentially room to improve reliability of a package while efficiently removing heat.

SUMMARY OF THE INVENTION

There may be a need for a package allowing for an efficient removal of heat generated during operation while ensuring reliability of the package.

According to an exemplary embodiment, a package is provided which comprises at least one electronic chip, a first heat removal body thermally coupled to a first main surface of the at least one electronic chip and configured for removing thermal energy from the at least one electronic chip, an encapsulant encapsulating at least part of the at least one electronic chip, and part of the first heat removal body (in particular only part, so that the first heat removal body forms part of an exterior surface of the package, which is advantageous in terms of its heat removal capability), wherein at least part of a surface of the first heat removal body is roughened.

According to another exemplary embodiment, a double-sided cooling package is provided which comprises at least one electronic chip from which thermal energy is removable via two opposing main surfaces of the package, an encapsulant encapsulating at least part of the at least one electronic chip, and an electrically conductive contact structure extending partially within and partially outside of the encapsulant and being electrically coupled with the at least one electronic chip, wherein at least a part of a surface of the electrically conductive contact structure within the encapsulant is roughened (in particular micropatterned).

According to still another exemplary embodiment, a package is provided which comprises a chip carrier comprising a copper surface, a semiconductor chip mounted on the chip carrier, at least one heat removal body comprising a copper surface thermally coupled to the semiconductor chip and configured for removing thermal energy from the semiconductor chip, and a mold-type encapsulant encapsulating at least part of the semiconductor chip, at least part of the chip carrier, and at least part of the at least one heat removal body, wherein at least part of at least one of the copper surfaces is roughened.

According to still another exemplary embodiment, a vehicle is provided which comprises a package having the above mentioned features.

According to yet another exemplary embodiment, a method of manufacturing a package is provided, wherein the method comprises thermally coupling a first heat removal body to a first main surface of at least one electronic chip for removing thermal energy from the at least one electronic chip, thermally coupling a second heat removal body to a second main surface of the at least one electronic chip or of at least one further electronic chip for removing thermal energy from the at least one electronic chip, encapsulating at least part of the at least one electronic chip or of the at least one further electronic chip, part (in particular only part, so that the first heat removal body forms part of an exterior surface of the package, which is advantageous in terms of its heat removal capability) of the first heat removal body and part (in particular only part, so that the second heat removal body forms part of an exterior surface of the package, which is advantageous in terms of its heat removal capability) of the second heat removal body by an encapsulant, and roughening (in particular micropatterning) at least part of a surface of at least one of the first heat removal body and the second heat removal body.

According to yet another exemplary embodiment, a method of manufacturing a package is provided which comprises configuring at least one electronic chip so that thermal energy is removable from the at least one electronic chip via at least one main surface of the package, encapsulating at least part of the at least one electronic chip by an encapsulant, providing an electrically conductive contact structure extending partially within and partially outside of the encapsulant, having a copper surface, and being electrically coupled with the at least one electronic chip, and roughening at least a part of the copper surface of the electrically conductive contact structure within the encapsulant.

According to yet another exemplary embodiment, a package having the above mentioned features is used for an automotive application.

An exemplary embodiment may have the advantage that the removal of heat generated by the one or more semiconductor chips during operation of the package may be highly efficient as a consequence of the provision of a heat removal body on at least one side, preferably on both sides, of one or more electronic chips of a package. At the same time, the high thermal load which a package has to bear during operation and which conventional results in the danger of delamination between the encapsulant and further constituents of the package can be prevented from deteriorating reliability of the package by the adhesion promoting and delamination suppressing effect of at least one roughened metallic surface in an interior of the package. Delamination is undesired since it may cause the generation of small gaps or hollow spaces within the package in which moisture, dirt or other contaminants may enter. This is undesired in terms of reliability. It has turned out to that surface roughening of such a metallic, in particular copper, surface may reduce the tendency of delamination between metallic constituents and encapsulant even in the presence of high mechanical or thermal load. Consequently, a package according to an exemplary embodiment of the invention may combine a pronounced heat removal capability with a high electrical and mechanical reliability and robustness even under harsh conditions.

DESCRIPTION OF FURTHER EXEMPLARY EMBODIMENTS

In the following, further exemplary embodiments of the packages, the vehicle, and the methods will be explained.

In an embodiment, the first heat removal body (and/or an optional second heat removal body) may comprise a material having a high thermal conductivity so as to be capable of efficiently removing heat from the one or more electronic chips to an environment of the package. In particular, the thermal conductivity of at least one of the heat removal bodies as a whole or a material thereof may be at least 10 W/mK, in particular at least 50 W/mK.

In an embodiment, the package comprises a second heat removal body thermally coupled to a second main surface of the at least one electronic chip and/or of at least one further electronic chip of the package and configured for removing thermal energy from the at least one electronic chip and/or of the at least one further electronic chip. The encapsulant may encapsulate part (in particular only part, so that the second heat removal body forms part of an exterior surface of the package, which is advantageous in terms of its heat removal capability) of the second heat removal body. At least part of a surface of the second heat removal body may be roughened. The provision of two heat removal bodies allows for a double-sided cooling architecture (see for instance FIG. 1 and FIG. 2), wherein the simultaneous roughening or micropatterning of surface portions of the heat removal body or bodies contacting the encapsulant improves the mechanical robustness of the package.

In an embodiment, the roughened surface is a micropatterned surface. In the context of the present application, the term "micropatterned" may particularly denote a configuration of a roughened surface in which the roughened surface has a spatial pattern of alternating microprotrusions and microindentations with a dimension in the order of magnitude of micrometers, in particular having dimensions of at least 1 µm or more. It has turned out that this kind of roughening has a specifically strong impact on the robustness against delamination. The micropatterning may comprise a regular (for instance matrix-like) or an irregular (for instance random) arrangement of microprotrusions and microindentations.

In an embodiment, the package comprises a chip carrier on which the at least one electronic chip is mounted. It is also possible that more than one chip carriers are provided in the package and/or that more than one electronic chip is mounted on one and the same chip carrier.

In an embodiment, the first heat removal body is configured as the chip carrier. In such a configuration, the first heat removal body may simultaneously serve for carrying the at least one electronic chip and for removing heat from the package, which heat is generated by the chip(s) during operation of the package.

In an embodiment, at least one of the first heat removal body and the second heat removal body comprises an electrically insulating (and preferably highly thermally conductive) layer having a first main surface covered by a first electrically conductive layer and having a second main surface covered by a second electrically conductive layer. For example, the electrically insulating layer may be simultaneously highly thermally conductive, which can be accomplished for example by the provision of a ceramic layer. At least one of the electrically conductive layers may be a copper layer combining a high thermal conductivity with a high electrical conductivity. However, aluminum is also a proper material selection for at least one of the electrically conductive layers. For instance, at least one of the first heat removal body and the second heat removal body may be configured as at least one of the group consisting of a Direct Copper Bonding substrate (DCB), and a Direct Aluminum Bonding substrate (DAB).

Alternative chip carriers which may be used for other embodiments can be any interposer like a substrate, a ceramic substrate, a laminar substrate, a leadframe, an IMS (Insulated Metal Substrate), a PCB (printed circuit board), etc.

In an embodiment, at least part of an electrically conductive surface of at least one of the first heat removal body and the second heat removal body being in direct contact with the encapsulant is micropatterned. Hence, at least part of at least one of the previously mentioned electrically conductive layers may be roughened for promoting adhesion with an encapsulant (in particular a mold-type encapsulant).

In an embodiment, the package comprises an electrically conductive contact structure, in particular a leadframe, extending partially within and partially outside (in particular forming one or more exposed leads) of the encapsulant and being electrically coupled with the at least one electronic chip (for instance by wire bonding). By such an electrically conductive contact structure, the at least one electronic chip may be coupled to an electronic environment of the package. For this purpose, one or more legs of the electrically conductive contact structure may extend beyond the encapsulant. A leadframe may be a metal structure partially inside a chip package that is configured for carrying signals from the electronic chip to the outside, and/or vice versa. The electronic chip inside the package or electronic component may be attached to the leadframe, and then bond wires may be provided for attaching pads of the electronic chip to leads of the leadframe. Subsequently, the leadframe may be molded in a plastic case or any other encapsulant.

In an embodiment, at least a part of a surface of the electrically conductive contact structure within the encapsulant is micropatterned. Thus, additionally or alternatively to the roughening of at least one heat removal bodies, it is also possible to roughen the electrically conductive contact structure, for instance partly or entirely to improve adhesion and to suppress delamination.

In a preferred embodiment, the encapsulant is a mold compound. The reason is that the tendency of delamination is particularly pronounced between a mold-type encapsulant and a metallic, in particular copper, surface, of a constituent (such as a heat removal body) of a package. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the roughened surface has microstructures with dimensions in a range between 0.25 µm and 20 µm, in particular in a range between 1 µm and 4 µm. For example, such a roughness may relate to an Ra roughness of the surface. When the dimensions become too small or to large, the impact on the improved adhesion may become too small.

In an embodiment, the micropatterned surface is configured for promoting adhesion with the encapsulant. This can be accomplished by a microscopic interlocking or clamping between microprotrusions of the roughened surface and material of the encapsulant which may flow into microindentations of the roughened surface during the encapsulation procedure.

In an embodiment, the micropatterned surface is a copper surface. It has turned out that the micropatterning of a copper surface allows to particularly efficiently improve the adhesion within the package, thereby reduces the tendency of delamination, and at the same time provides a strong contribution to both electrical conductivity and thermal conductivity.

In an embodiment, the micropatterning procedure is carried out before mounting (in particular before at least one of soldering, welding and wire bonding) the at least one electronic chip on a chip carrier (in particular on at least one of the first heat removal body and the second heat removal body). By taking this measure, it can be ensured that the micropatterning procedure (which may be a chemical and/or mechanical procedure) does not deteriorate or damage the sensitive electronic chip(s).

In an alternative embodiment, the roughening is carried out after mounting, in particular after at least one of soldering, welding and wire bonding, the at least one electronic chip on a chip carrier, in particular on at least one of the first heat removal body and the second heat removal body. When a chip is implemented which does not involve sophisticated combinations of metallic materials at its surface which can be prone of generating a battery effect upon roughening the chip, it can be even advantageous to mount the chip already before roughening so that also the chip surface is roughened. This further improves the adhesion properties, since any delamination between the chip and surrounding encapsulation material can be prevented by taking this measure.

In an embodiment, the micropatterning is carried out by roughening the surface, in particular by at least one of chemically roughening and mechanically roughening the surface. Chemically roughening may be accomplished by etching procedures, in particular by a combination of a deposition and an etching procedure. Mechanically roughening procedures may impact a surface to be roughened as well. Also laser roughening or plasma roughening may be implemented.

In an embodiment, the roughening is carried out by oxidizing part of a copper surface by a first etching procedure, and by subsequently removing generated copper oxide by a second etching procedure. This results in a dirt-free and well defined surface which can properly adhere to mold compound material.

In an embodiment, the surface to be roughened is cleaned prior to the micropatterning. This can further improve the adhesion properties at the interface of the metal surface with regard to the encapsulant.

In an embodiment, an adhesion promoter is applied to the surface. By applying an additional adhesion promoter, for instance silane, adhesion can be further improved and reliability of the package can be further increased. Such a combination of roughening and provision of an adhesion promoting agent is highly efficient in terms of suppressing delamination.

In an embodiment, particles are removed from the micropatterned surface after the micropatterning, in particular by deoxidizing. More specifically, metal oxide which may be produced during the micropatterning procedure may be removed before encapsulation, thereby further increasing the mechanical robustness of the manufactured package.

A roughening procedure may be carried out by an exemplary embodiment of the invention as follows: A copper surface may be made subject to an etching procedure using an acid (such as $H_2SO_4$) having an additive (for instance an organic additive) functioning as a local etch inhibitor (i.e. locally blocking etching of the copper surface). This generates a pattern of etched (generating microindentations) and non-etched (generating microprotrusions) regions. It is also possible that an etching procedure is carried out allowing for an etching predominantly at crystalline defects. The etching can convert the copper to copper oxide, leaving however local copper islands or spots unetched. The copper oxide may be removed (for instance chemically or mechanically), resulting in a clean roughened copper surface.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 shows a cross-sectional view of a double-sided cooling package according to an exemplary embodiment.

FIG. 2 shows a cross-sectional view of a double-sided cooling package according to another exemplary embodiment.

DETAILED DESCRIPTION OF EXEMPLARY EMBODIMENTS

Figure 3:
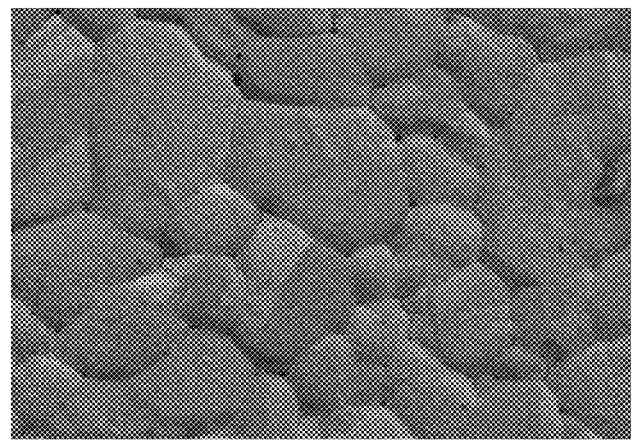
FIG. 3 to FIG. 5 show a roughened copper surface of a Direct Copper Bonding substrate of a package according to an exemplary embodiment in three different magnifications.

The illustration in the drawing is schematically.

Before describing further exemplary embodiments in further detail, some basic considerations of the present inventors will be summarized based on which exemplary embodiments have been developed which provide for an efficient cooling of a reliable package.

According to an exemplary embodiment of the invention, an adhesion promoting function for a package or module is provided by roughening one or more or all metallic structures before soldering or wire bonding one or more chips, and in particular before encapsulation. By taking this measure, adhesion between an encapsulant (such as a mold compound) on the one hand and electrically conductive surfaces (such as copper surfaces) of the package on the other hand can be improved. This advantageously suppresses the tendency of thermally induced delamination between material of the encapsulant and the substrate (such as a Direct Copper Bonding (DCB) substrate, a leadframe, etc.).

Conventionally, a DCB and a leadframe surface may be cleaned after soldering of chip, leadframe, spacer, etc. By taking this measure, organic contaminations may be removed from the surface and/or may be oxidized in an oven process in order to improve adhesion of a mold compound. In this context, silane-based adhesion promoters of the mold compound may contribute. By the high mechanical stress which may occur in packages implementing double-sided cooling (in particular in the vertical direction), it however occurs frequently that the mold compound delaminates from the metallic surfaces of such a conventionally treated package. In particular when carrying out a stress test (for example a TST-test), such delaminations are easily visible.

It is also conventionally known to apply adhesion promoting processes implementing chemistry. However, such processes are frequently not applicable for chip packaging, since the used chemistry may disturb the electric function of the electronic chip(s) of the package.

In order to overcome the above described shortcomings, an exemplary embodiment of the invention cleans and pre-roughens a copper surface of a DCB and/or a leadframe of a package (in particular of a power package) in such a manner that a micropatterned surface is formed which—optionally additionally to chemical bonds with an adhesion promoter of a mold compound—provides for a proper mechanical form closure or microscopic interlocking between mold compound and the micropatterned copper surface of DCB and leadframe.

By taking this measure, an additional mechanical adhesion contribution between mold compound and copper surfaces of DCB and leadframe may be obtained. Moreover, the one or more electronic chips of such a package may be safely prevented from being deteriorated by such a treatment, since the roughening may be carried out prior to the chip soldering. Also the implementation of standard chip metallization is compatible with such a procedure.

According to an exemplary embodiment of the invention, a micropatterned surface is in particular implemented on a DCB and/or a leadframe of a double-sided cooled module (although other embodiments relate to single-sided cooling). Highly advantageously, such roughening or micropatterning can be carried out prior to chip soldering, chip wire bonding, leadframe soldering, leadframe welding, etc. In particular the roughening of a copper surface of a heat removal body and/or a chip carrier of a package under manufacture has turned out to be highly advantageous in terms of improving adhesion and preventing delamination. In this context, the term "roughening" should be understood in a broad way and should not only cover mechanically roughening, but also chemically roughening and other techniques resulting in the formation of a micropatterned surface. Advantageously, loose copper particles lying on the roughened surface after the roughening procedure may be removed prior to encapsulation, to thereby further improve the adhesion properties.

According to an exemplary embodiment of the invention, a chemical process may be carried out for roughening by which grain boundaries of the copper surface may be etched. For example, this can be accomplished by a chemistry being commercially available by Mc Dermid (Multibond 100). Prior to the roughening, it is advantageously possible to carry out a copper cleaning procedure in order to prevent defects due to shadowing effects (which may be caused by a dirt cover or the like). For this purpose, it is possible to use for instance an alkaline cleaning agent, followed by a copper oxide removal procedure (for instance MSA). After that, deoxidizing (i.e. removal of loose copper particles) may be accomplished, which can be carried out for example by an appropriate acid (such as $H_2SO_4$). Before this, it is possible to remove a possible dirt layer which the chemistry of the roughening procedure may cause (for instance BTA). It is also possible to carry out fully integrated procedures (pre-dip, coating solution, post-dip, etc.).

Apart from the described procedures, it is possible to carry out a mechanical procedure (for instance a beam of glass spheres), galvanic procedures (for instance deposition of raw copper), or other procedures capable of generating microstructures.

Highly advantageously, chip soldering is carried out only after having completed the roughening procedure. As a consequence, it is possible to implement standard chips.

FIG. 1 shows a cross-sectional view of a double-sided cooling package 100 according to an exemplary embodiment.

The package 100 according to FIG. 1 comprises two electronic chips 102 which are here embodied as power semiconductor chips. The electronic chip 102 shown on the left hand side of FIG. 1 may be a diode chip, whereas the electronic chip 102 shown on the right-hand side of FIG. 1 may be an IGBT (Insulated Gate Bipolar Transistor) chip.

A first heat removal body 104, which is here embodied as Direct Copper Bonding (DCB) substrate, is thermally and mechanically coupled to a first main surface of the electronic chips 102 and forms part of an exterior surface of the package 100. The first heat removal body 104 is configured for removing thermal energy from the electronic chips 102 during operation of the package 100 to a package external cooling body and/or cooling fluid (not shown). The first heat removal body 104 comprises a central electrically insulating and thermally conductive layer 110, here made of ceramic material, having a first main surface covered by a first electrically conductive layer 112, which is here embodied as a copper layer, and having an opposing second main surface covered by a second electrically conductive layer 114, which is here embodied as a further copper layer. The electronic chips 102 are mounted and soldered on the first heat removal body 104 and are electrically connected with the first electrically conductive layer 112 by bond wires 170. Hence, the first heat removal body 104 functions as a chip carrier and as a heat sink. The second electrically conductive layer 114 of the first heat removal body 104 forms part of an exterior surface of the package 100 and thereby significantly contributes to the heat removal from the electronic chips 102 during operation of the package 100.

Optional spacer bodies 172, which may be embodied as copper blocks, are soldered onto upper main surfaces of the electronic chips 102.

Moreover, a second heat removal body 106 is thermally coupled to a second main surface of the electronic chips 102 via the spacer bodies 172. Also the second heat removal body 106 comprises a central electrically insulating and thermally conductive layer 110, which may be made of ceramic, having a first main surface covered by a first electrically conductive layer 112, which is here embodied as a copper layer, and having an opposing second main surface covered by a second electrically conductive layer 114, which is here embodied as a further copper layer. The first electrically conductive layer 112 of the second heat removal body 106 is soldered onto the spacer bodies 172. The second electrically conductive layer 114 of the second heat removal body 106 forms part of an exterior surface of the package 100 and thereby significantly contributes to the heat removal from the electronic chips 102 during operation of the package 100. As a whole, the second heat removal body 106 is configured as a heat sink for removing thermal energy from the electronic chips 102.

An electrically conductive contact structure 118, here embodied as a leadframe, extends partially within and partially outside of the encapsulant 108 and is electrically coupled with the electronic chips 102 via a solder connection with the patterned first electrically conductive layer 112 of the first heat removal body 104 and via the bond wires 170.

Furthermore, the package 100 comprises a mold-type encapsulant 108 encapsulating the electronic chips 102, the spacer bodies 172, only part of the electrically conductive contact structure 118, only part of the first heat removal body 104 and only part of the second heat removal body 106. The part of the electrically conductive contact structure 118 encapsulated by the encapsulant 108 serves for electrically contacting the electronic chips 102, whereas another part of the electrically conductive contact structure 118 exposed from the encapsulant 108 provides one or more leads for connection with an electronic periphery device (not shown). Since the electrically conductive contact structure 118 extends partially within and partially outside of the encapsulant 108 and is electrically coupled with the electronic chips 102, it is capable of providing an electric coupling between an exterior and an interior of the package 100.

As can be taken from a first detail 174, the part of the copper surface of the first heat removal body 104 being in direct contact with the encapsulant 108 is roughened by micropatterning, see microstructures 120. As can be taken from a second detail 176, the part of the copper surface of the second heat removal body 106 being in direct contact with the encapsulant 108 is roughened by micropatterning, see microstructures 120. As can be taken from a third detail 178, the part of the copper surface of the electrically conductive contact structure 118 being in direct contact with the encapsulant 108 is roughened by micropatterning as well, see microstructures 120.

Preferably, the roughened copper surfaces have microstructures 120 with dimensions in a range between 1 μm and 4 μm, for instance with dimensions of about 2 μm. Referring to a further detail 190 (relating exemplarily to the electrically conductive contact structure 118, but being applicable to the heat removal bodies 104, 106 as well) of FIG. 1 this means that a height difference between top positions 192 and bottom positions 194 of the microstructures 120 may be in a range between 1 μm and 4 μm. Contrary to this, a smooth copper surface may for instance have a corresponding roughness of 0.1 μm.

Due to the provision of the first heat removal body 104 and the second heat removal body 106, the package 100 is configured for double-sided cooling. In other words, the two electronic chips 102 are connected to the two heat removal bodies 104, 106 so that thermal energy is removable from two opposing main surfaces of the package 100. Thus, the cooling efficiency of the package 100 is very high. However, the enormous amount of heat generated by the package 100 during operation of the package 100 and the removal of such a large amount of heat also generates high thermal load within the package 100. This conventionally results in the danger of delamination within the package 100. However, due to the roughening of the various copper surfaces, as described above, the adhesion between the encapsulant 108 and the adjacent copper structures (see reference numerals 104, 106, 118) can be significantly increased.

Highly advantageously, the procedure of micropatterning the mentioned copper surfaces may be carried out—during the manufacture of the package 100—before mounting, soldering and wire bonding the electronic chips 102 on the first heat removal body 104. Thus, it can be ensured that the sensitive electronic chips 102 are not negatively influenced by the roughening procedure. The roughening may be carried out by oxidizing part of a respective copper surface by a first etching procedure, and by subsequently treating the so obtained structure with a second etching procedure to obtain a bondable and/or solderable and/or sinterable surface. The reproducibility and quality of the micropatterning can be further improved by cleaning the surface to be roughened prior to the micropatterning. To further improve adhesion between the micropatterned copper surfaces and the encapsulant 108, an adhesion promoter 124 can be applied to the interface. The latter measure is shown only for the first heat removal body 104, but can be applied, vice versa, also to the second heat removal body 106 and/or to the electrically conductive contact structure 118. Another option to further improve the adhesion is to remove particles from the micropatterned surface after the micropatterning, in particular by deoxidizing. For instance, copper oxide or another oxide may be removed by such a procedure. It may however also be advantageous when a certain amount of copper oxide remains on the surface.

The package 100 may be manufactured as follows: The heat removal bodies 104, 106 as well as the electrically conductive contact structure 118 may be roughened by etching. Thereafter, the electronic chips 102 may be soldered onto the first heat removal body 104. After that, connection of the electrically conductive contact structure 118 with the first heat removal body 104 may be accomplished by soldering, wire bonding, etc. Then, the optional spacer bodies 172 may be soldered on top of the electronic chips 102. This can be followed by a solder connection of the second heat removal body 106 on the spacer bodies 172. After that, encapsulation by molding may be carried out so that the encapsulant 108 fills the gaps between the mentioned constituents and keeps external surfaces of the heat removal bodies 104, 106 uncovered.

FIG. 2 shows a cross-sectional view of a double-sided cooling package according to another exemplary embodiment.

The embodiment according to FIG. 2 differs from the embodiment according to FIG. 1 in that the electrically conductive contact structure 118, embodied as a leadframe, is coupled by welding and by bond wires 170 to both respective first electrically conductive layers 112 of the first heat removal body 104 and of the second heat removal body 106. Spacer bodies 172 are omitted in the embodiment of FIG. 2. Furthermore, the double-sided cooling architecture according to FIG. 2 couples a respective one of the electronic chips 102 with only a respective one of the heat removal bodies 104, 106. More precisely, the first heat removal body 104 is coupled only with one of the electronic chips 102 on a bottom side of the package 100, whereas the second heat removal body 106 is coupled only with the other of the electronic chips 102 on a top side of the package 100. Both first electrically conductive layers 112 are patterned according to FIG. 2. With regard to the formation of microstructures 120 in the embodiment of FIG. 2, reference is made to the corresponding description of FIG. 1.

Figure 4:
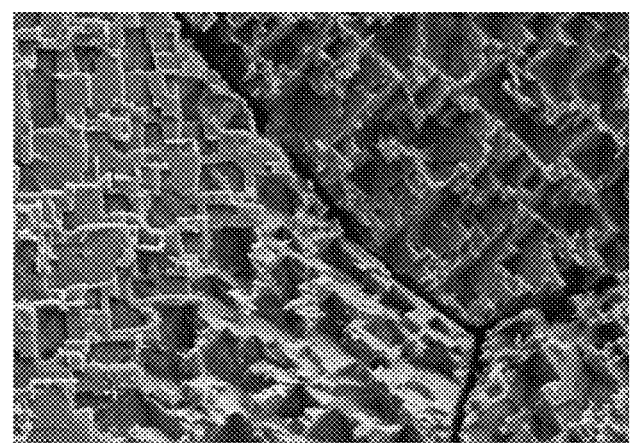
Figure 5:
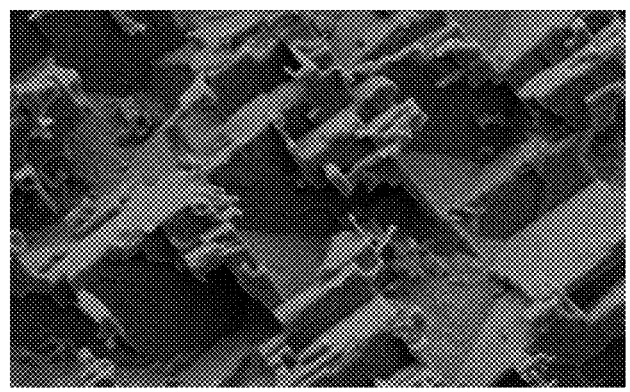

FIG. 3, FIG. 4 and FIG. 5 show a roughened copper surface of a Direct Copper Bonding substrate as a heat removal body 104, 106 of a package 100 according to an exemplary embodiment in three different magnifications. FIG. 3 to FIG. 5 show a high homogeneity in the roughened copper surface. The DCB microstructure is shown after copper roughening.

Figure 6:
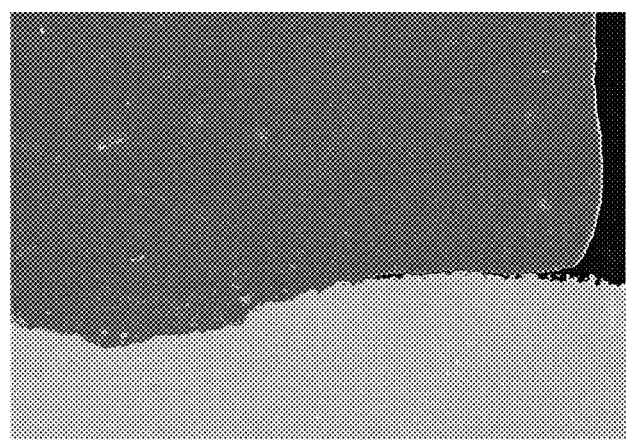
FIG. 6 shows an image of a portion of a package according to an exemplary embodiment illustrating a transition between a roughened copper surface and an adjacent encapsulant.

FIG. 6 shows an image of a portion of a package 100 according to an exemplary embodiment illustrating a transition between a roughened copper surface and an adjacent encapsulant 108.

Figure 7:
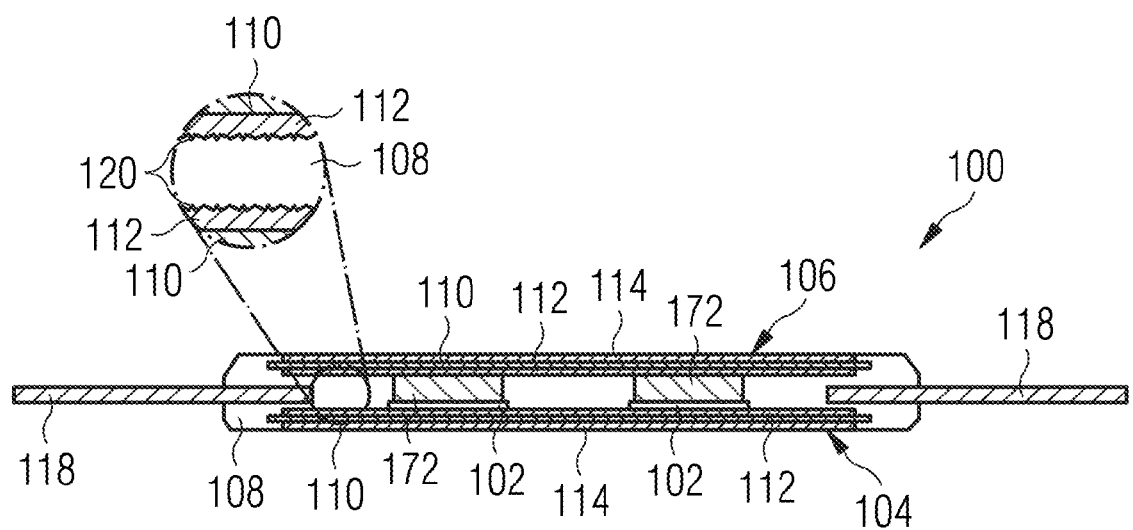
FIG. 7 shows a cross-sectional view of a double-sided cooling package according to another exemplary embodiment.

FIG. 7 shows a cross-sectional view of a double-sided cooling package 100 according to another exemplary embodiment. According to FIG. 7, being similar to FIG. 1, the copper surfaces of the heat removal bodies 104, 106 in contact with the encapsulant 108 are micropatterned. Micropatterning of the electrically conductive contact structure 118 may be omitted in this embodiment.

Figure 8:
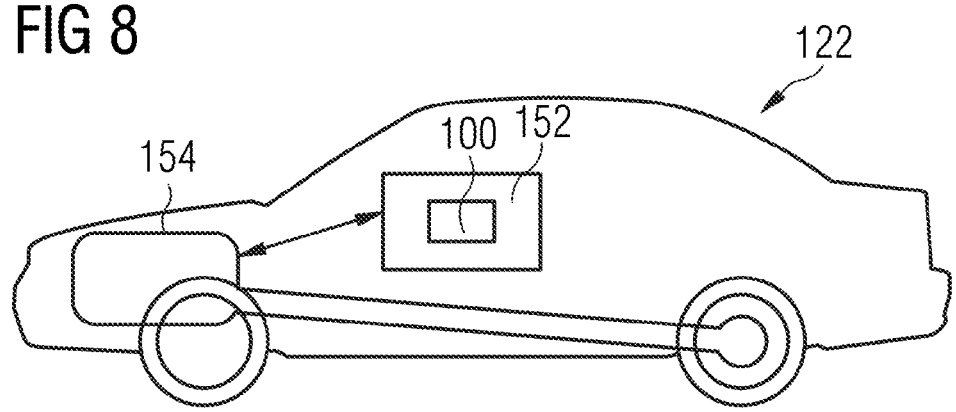
FIG. 8 shows a schematic view of a vehicle with a package according to an exemplary embodiment.

FIG. 8 shows a schematic view of a vehicle 122 with a package 100 according to an exemplary embodiment.

More specifically, the power package 100 may form part of a control block 152 controlling operation of engine/battery block 154. Hence, a package 100 or power module according to an exemplary embodiment of the invention may be used for an automotive application. A preferred application of such a power package 100 is an implementation as an inverter circuit or inverted rectifier for vehicle 122 which may be an electrically driven vehicle or which may be a hybrid vehicle. Such an inverter may transfer a direct current (DC) of the battery into an alternating current (AC) for driving the electric engine of vehicle 122. In a hybrid vehicle, it is also possible to at least partially recover mechanical energy and to transfer it, by the inverter, back into electric energy to recharge the battery. In such an automotive inverter application, extreme amounts of heat are generated during operation of the power package 100. This heat can be efficiently removed by the double-sided cooling concept described above. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   at least one electronic chip;
   a first heat removal body thermally coupled to a first main surface of the at least one electronic chip and configured for removing thermal energy from the at least one electronic chip;
   a second heat removal body thermally coupled to a second main surface of the at least one electronic chip or of at least one further electronic chip and configured for removing thermal energy from the at least one electronic chip or of the at least one further electronic chip;
   an encapsulant encapsulating at least part of the at least one electronic chip, and part of the first heat removal body;
   wherein at least part of a surface of the first heat removal body is roughened,
   wherein the encapsulant encapsulates part of the second heat removal body; and
   wherein at least part of a surface of the second heat removal body is roughened,
   wherein at least one of the first heat removal body and the second heat removal body comprises an electrically insulating layer having a first main surface covered by a first electrically conductive layer,
   wherein at least part of the electrically conductive layer of at least one of the first heat removal body and the second heat removal body being in direct contact with the encapsulant is roughened.

2. The package according to claim 1, comprising a chip carrier on which the at least one electronic chip is mounted.

3. The package according to claim 2, wherein the first heat removal body is configured as the chip carrier.

4. The package according to claim 1, wherein the electrically insulating layer having a second main surface covered by a second electrically conductive layer.

5. The package according to claim 1, wherein at least one of the first heat removal body and the second heat removal body is configured as at least one of the group consisting of a Direct Copper Bonding substrate, and a Direct Aluminum Bonding substrate.

6. The package according to claim 1, comprising an electrically conductive contact structure, in particular a leadframe, extending partially within and partially outside of the encapsulant and being electrically coupled with the at least one electronic chip.

7. The package according to claim 6, wherein at least a part of a surface of the electrically conductive contact structure within the encapsulant is roughened.

8. The package according to claim 1, wherein the roughened surface has microstructures with dimensions in a range between 0.25 µm and 20 µm, in particular in a range between 1 µm and 4 µm.

9. A vehicle, comprising a package according to claim 1.

* * * * *